United States Patent
Morita

[11] Patent Number: 5,992,172
[45] Date of Patent: Nov. 30, 1999

[54] FAST THIN-PLATE COOLING APPARATUS

[75] Inventor: Hideo Morita, Tsukuba-gun, Japan

[73] Assignee: SMC Corporation, Tokyo, Japan

[21] Appl. No.: 09/079,550

[22] Filed: May 15, 1998

[30] Foreign Application Priority Data

Jun. 10, 1997 [JP] Japan .................................. 9-168092

[51] Int. Cl.$^6$ .................................................. E25B 21/02
[52] U.S. Cl. .................................................. 62/307; 62/335
[58] Field of Search ................................ 62/3.2, 3.3, 3.7, 62/335

[56] References Cited

U.S. PATENT DOCUMENTS

| | | | |
|---|---|---|---|
| 4,066,365 | 1/1978 | Staunton ................................. | 356/244 |
| 4,947,648 | 8/1990 | Harwell et al. ........................... | 62/3.2 |
| 5,431,021 | 7/1995 | Gwilliam et al. ......................... | 62/3.7 |
| 5,522,215 | 6/1996 | Matsunaga et al. ....................... | 62/3.2 |
| 5,605,048 | 2/1997 | Koslov et al. ............................ | 62/3.7 |
| 5,802,856 | 9/1998 | Schaper et al. .......................... | 62/3.7 |

OTHER PUBLICATIONS

Patent Abstracts of Japan, vol. 10, No. 212, Jul. 24, 1986, JP 61–052627, Mar. 15, 1986.

*Primary Examiner*—William Doerrler
*Attorney, Agent, or Firm*—Oblon, spivak, McClelland, Maier & Neustadt, P.C.

[57] ABSTRACT

An upper thermo module 4 is sandwiched between a cooling plate 1 the top surface of which is a cooling surface 10 for a thin plate W and an intermediate plate 2 forming a heat accumulator, while a lower thermo module 5 is sandwiched between the said intermediate plate and a water cooling plate 3. A temperature controller 6 operates both thermo modules 4 and 5 to transfer heat from the cooling plate 1 to the intermediate plate 2 and then to the water cooling plate 3 in order to set the temperature of the cooling plate 1 to a specified target value.

3 Claims, 1 Drawing Sheet

FAST THIN-PLATE COOLING APPARATUS

FIELD OF THE INVENTION

The present invention relates to a fast thin-plate cooling apparatus that is used in various processes involving thin plates, including the lamination of thin plates and the processing of glass plates to cool such plates down to a predetermined temperature at a high speed.

PRIOR ART

A known cooling apparatus for cooling a thin plate down to a specified temperature uses a thermo module (a Peltier element). In this thin-plate cooling apparatus, several thermo modules are arranged and sandwiched between a cooling plate the top surface of which is a cooling surface and a water-cooling plate through which cooling water can be passed, and a temperature-controlling sensor is provided on the cooling plate to allow a temperature controller to provide PID control for the temperature of the cooling plate based on the output from the temperature-controlling sensor.

To improve the thin-plate cooling performance of this thin-plate cooling apparatus, and to increase the cooling speed, it is advantageous, to increase the number of thermo modules. The number of thermo modules that can be installed is limited due to limitations on the area of the cooling plate, thereby limiting the improvement of the cooling performance (i.e., the reduction of the cooling time).

DISCLOSURE OF THE INVENTION

It is a technical object of this invention to use a thin-plate cooling apparatus using thermo modules to enable a thin plate to be cooled more quickly.

It is another technical object of this invention to provide a fast thin-plate cooling apparatus that can reduce the thin-plate cooling time by increasing the cooling speed, that can deal promptly with a change in set target cooling temperature associated with a change in the type of thin-plate used, and that can increase the setting temperature range.

To achieve these objects, a fast thin-plate cooling apparatus according to this invention is an apparatus for cooling a thin plate characterized in that an upper thermo module is sandwiched between a cooling plate the top surface of which is a cooling surface for the thin plate and an intermediate plate forming a heat accumulator, in that a lower thermo module is sandwiched between the intermediate plate and a water cooling plate located below the intermediate plate, and in that the apparatus includes a temperature controller for operating both thermo modules to transfer heat from the cooling plate to the intermediate plate and then to the water cooling plate in order to set the temperature of the cooling plate to a specified target value.

In the fast thin-plate cooling apparatus, the temperature controller controls the conduction to the lower thermo module in order to set the temperature of the intermediate plate to a specified value for the cooling plate or the same value minus an offset value. In addition, temperature sensors for detecting the temperatures of the cooling and intermediate plates can be installed inside these plates, and the temperature controller can control a power supply for providing power to both thermo modules, based on an external signal indicating the start of temperature control and the output from the temperature sensor.

When this fast thin-plate cooling apparatus is used to cool a thin plate, the temperature controller activates both thermo modules based on the external signal in order to transfer heat from the cooling plate to the intermediate plate until the temperature of the cooling plate reaches the target value, while simultaneously controlling the temperature of the intermediate plate that forms a heat accumulator, to the target value for the cooling plate or the same value minus an offset value. This operation allows the cooling plate and thus the thin plate on the cooling surface to be cooled at a high speed. Furthermore, since only a amount of heat is transferred to set the temperature of the cooling plate to the target value, this apparatus can cope promptly with a change in set target cooling temperature associated with a change in thin-plate type, thereby increasing the setting temperature range.

DETAILED DESCRIPTION

Figure 1:
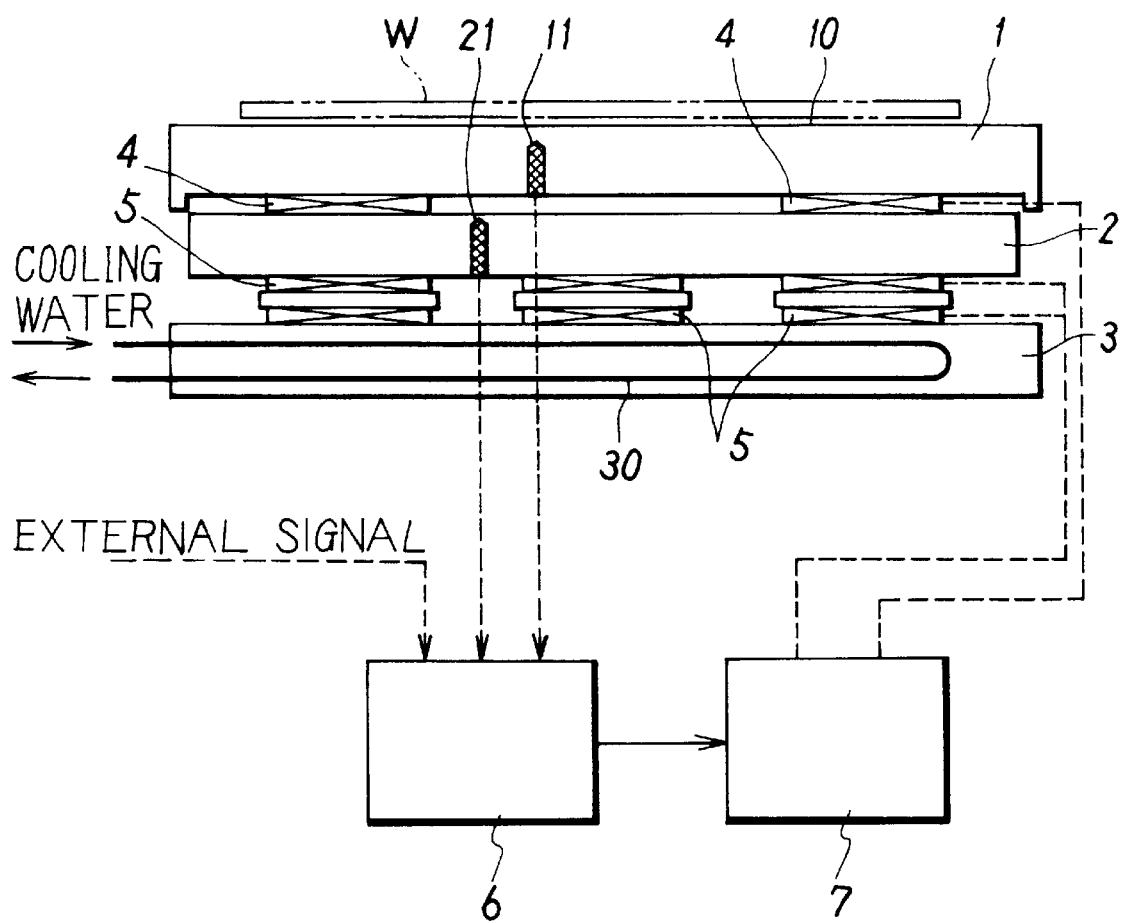
FIG. 1 is a schematic explanatory drawing of an embodiment of a fast thin-plate cooling apparatus according to this invention.

FIG. 1 shows a basic configuration of an embodiment of a fast thin-plate cooling apparatus according to this invention. In this fast thin-plate cooling apparatus, an upper thermo module (a Peltier element) 4 is sandwiched between a cooling plate 1 the top surface of which is a cooling surface 10 for a thin plate W and an intermediate plate 2 that forms a heat accumulator, and a lower thermo module (a Peltier element) 5 is sandwiched between the intermediate plate 2 and a water cooling plate 3 located below the intermediate plate 2.

The thermo modules 4 and 5 are desirably disposed as closely as possible between the cooling plate 1 and the intermediate plate 2 and between the intermediate plate 2 and the water cooling plate 3 in order to improve the thin-plate cooling performance and speed. In the illustrated embodiment, the lower thermo module 5 comprises two vertical stacked layers, but this configuration is provided to maintain a difference in temperature between the top and bottom surfaces of the lower thermo module 5 and not to improve the effectiveness of the thermo module.

A cooling channel 30 is provided in the water cooling plate 3 so that a liquid (water) flows through the channel to cool the water cooling plate 3, and is connected to a cooling water supply source.

A first temperature sensor 11 for detecting the temperature of the cooling surface 10 to control its temperature is installed inside the cooling plate 1, a second temperature sensor 21 for detecting the temperature of the intermediate plate 2 to control its temperature is installed inside the intermediate plate 2, and these temperature controllers 11 and 21 are connected to the temperature controller 6.

Based on a thin-plate supply timing signal from a sequencer that controls the supply of thin plates W or an external signal from a sensor indicating that the thin plate W has been loaded on the cooling surface 10 of the cooling plate 1 to start temperature control, and on the out put from the temperature sensors 11 and 12, the temperature controller 6 controls a power supply 7 that provides power to the thermo modules 4 and 5 in order to provide PID control for the output to the thermo modules 4 and 5.

According to a fast thin-plate cooling apparatus of the above configuration, in a standby state before the hot (e.g., about 100 C.) thin plate W to be cooled is placed on the cooling surface 10 of the cooling plate 1, the temperature of the cooling plate 1 is maintained at a cooling target value (e.g., 25 C.) for the thin plate W by the temperature controller 6 controlling the conduction to the upper thermo module 4. In addition, the temperature of the intermediate plate 2 is maintained at a set value for the cooling plate 1 or the same value minus an offset value (e.g., 20 C.) by the temperature controller 6 controlling the conduction to the lower thermo module 5.

When the hot thin plate W is placed on the cooling surface 10 of the cooling plate 1, the temperature of the cooling plate 1 increases. Thus, an external signal is input to the temperature controller 6 indicating that an increase in temperature is about to start or at least the first temperature sensor 11 detects this increase in temperature, and the temperature controller 6 fully activates the upper and lower thermo modules 4 and 5 to transfer heat from the cooling plate 1 to the intermediate plate 2 and then to the water cooling plate 3. Once the temperature of the cooling plate 1 has approached the set target value, the temperature controller returns to the original PID control. Specifically, the external signal indicating that the temperature control is to start is a thin-plate supply timing signal from a sequencer that controls the supply of thin plates W or a signal from a sensor indicating that the thin plate W has been loaded on the cooling surface 10 of the cooling plate 1. The external signal, however, is not limited to these signals but may be, for example, one that is issued when the first temperature sensor 11 detects a variation in temperature. In this case, the thin plate W can be cooled more promptly by controlling the thermo modules using a signal from the sequencer instead of starting the control of the thermo modules using the signal based on a variation in temperature.

In cooling the thin plate W, the heat capacity of the cooling plate 1 should be set based on the heat capacity of the thin plate W so that the increase in temperature caused by heat from the thin plate W falls within a specified allowable range. By sufficiently increasing the heat capacity of the cooling plate 1, the increase in the temperature of the cooling plate 1 can be limited to allow the thin plate W to be cooled at a high speed. If, however, the set target cooling temperature of the cooling plate 1 is changed to cool a different type of thin plate and if the heat capacity of the cooling plate 1 is high, a large amount of heat must be transferred to set the target value, thereby requiring a large amount of time to change the value. Thus, in view of the time required to change the target temperature, the heat capacity of the cooling plate 1 can be set at an appropriate value within a range in which this time can be reduced to a relatively small value.

Since the intermediate plate 2 forming a heat accumulator is maintained at the specified target temperature of the cooling plate 1 or a temperature slightly lower than the target value [temperature of the cooling plate]–[offset value], even if the cooling plate 1 is heated, it can be cooled at a high speed by fully operating the lower thermo module 5. As a result, the thin plate W on the cooling surface 10 is also cooled at a high speed. In particular, in offset control in which the temperature of the intermediate plate 2 is set at a value slightly lower than the specified target temperature of the cooling plate 1, i.e., [temperature of the cooling plate]– [offset value], the heat accumulation in the intermediate plate 2 enables most of the power of the upper thermo module 4 to be used to cool the thin plate W in order to accelerate the cooling.

The heat capacity of the intermediate plate 2 should also be set while taking into consideration the fast cooling of the cooling plate 1 and the time required to change the specified target cooling temperature of the cooling plate 1, but in general, it should ideally be nearly equal to the heat capacity of the cooling plate 1.

On the other hand, the water cooling plate 3 is cooled down to its cooling temperature by cooling water from a cooling-water source. Since, however, this cooling water is mainly used to discard heat transferred from the intermediate plate 2 via the lower thermo module 5, its temperature need not be particularly controlled to a specified value. Consequently, the heat transferred from the cooling plate 1 to the intermediate plate 2 or accumulated in the intermediate plate 2 is discarded by the thermo modules 4 and 5 into heat-radiating water flowing through the water cooling plate 3.

Since the waste heat effect increases as the number of thermo modules increases, the cooling capability of the cooling plate 3 must be correspondingly increased.

As described above, by locating the intermediate plate 2 forming an heat accumulator between the thermo modules (the upper and lower thermo modules 4 and 5) placed on each other so that the heat capacity of the intermediate plate 2 can be used as a low heat source when the thin plate W is placed on the cooling surface 10, and allowing the thermo modules 4 and 5 to independently control the temperatures of the cooling plate 1 and intermediate plate 2 based on the control by the temperature controller 6, the cooling plate 1 can be cooled at a high speed and a change in the specified target cooling temperature associated with a change in thin-plate W type can be dealt with promptly to increase the setting temperature range.

In other words, if the heat capacity of the cooling plate 1 is increased so as to correspond to the increase in the heat capacity of the intermediate plate 2 without the use of the intermediate plate 2, the cooling plate has a high heat capacity to prevent the temperature of the cooling surface 10 from increasing significantly when the thin plate W is loaded on the cooling plate, thereby enabling the thin plate W to be cooled at a high speed. If, however, the temperature of the cooling plate is set to the target value in response to a change in thin-plate W type, a large amount of heat must be transferred, and thus the change in set target cooling temperature cannot be dealt with promptly.

On the contrary, when the intermediate plate 2 forming a heat accumulator is located between the upper and lower thermo modules 4 and 5 as described above, the upper thermo module 4 causes the heat of the cooing plate 1 to be transferred quickly to the intermediate plate 2 to release the heat capacity of the intermediate plate 2, thereby enabling the most of the power of the upper thermo module 4 to be spent for cooling the thin plate W. Consequently, the thin plate W can be cooled at a high speed to reduce the amount of heat transferred to set the temperature of the cooling plate 1 at a target value, so a change in set target cooling temperature associated with a change in thin-plate W type can be coped with promptly.

The fast thin-plate cooling apparatus according to this invention enables the thin plate to be cooled at a high speed using the thin-plate cooling apparatus using the thermo modules. In addition to the reduction of the time required to cool the thin plate due to the increased cooling speed, this invention can promptly deal with a change in the specified target cooling temperature associated with a change in thin-plate type in order to increase the setting temperature range.

What is claimed is:

1. An apparatus for cooling a thin plate wherein:

an upper thermo module is sandwiched between a cooling plate the top surface of which is a cooling surface for the thin plate and an intermediate plate forming a heat accumulator, while a lower thermo module is sandwiched between said intermediate plate and a water cooling plate located below the intermediate plate, and wherein:

the apparatus includes a temperature controller for operating said upper and lower thermo modules simultaneously to transfer heat from the cooling plate to the intermediate plate and then to the water cooling plate in order to control the temperature of the cooling plate to a set target value;

wherein said temperature controller is configured to control the conduction to the lower thermo module in order to set the temperature of the intermediate plate to a target value for the cooling plate or the same value minus an offset value.

2. A fast thin-plate cooling apparatus according to claim 1 wherein temperature sensors for detecting the temperatures of the cooling and intermediate plates are installed inside these plates, and wherein said temperature controller controls a power supply for providing power to both thermo modules, based on an external signal indicating the start of temperature control and the output from the temperature sensor.

3. A fast thin-plate cooling apparatus according to claim 1, wherein said temperature controller includes means for operating said upper and lower thermo modules simultaneously at full power.

* * * * *